(12) United States Patent
Abramov et al.

(10) Patent No.: US 7,823,393 B2
(45) Date of Patent: *Nov. 2, 2010

(54) PELTIER COOLING SYSTEMS WITH HIGH ASPECT RATIO

(75) Inventors: Vladimir Semenovich Abramov, Moscow (RU); Alexander Valerievich Shishov, Moscow Region (RU); Nikolay Valentinovich Scherbakov, Moscow (RU); Valeriy Petrovich Sushkov, Moscow (RU); Alexey Alexovich Ivanov, Moscow (RU)

(73) Assignee: Light Engines Corporation, Moscow (RU)

( * ) Notice: Subject to any disclaimer, the term of this patent is extended or adjusted under 35 U.S.C. 154(b) by 0 days.

This patent is subject to a terminal disclaimer.

(21) Appl. No.: 12/166,889

(22) Filed: Jul. 2, 2008

(65) Prior Publication Data

US 2009/0007571 A1    Jan. 8, 2009

Related U.S. Application Data

(63) Continuation of application No. 11/316,178, filed on Dec. 22, 2005, now abandoned, which is a continuation of application No. 10/545,216, filed as application No. PCT/IB2004/000202 on Jan. 29, 2004, now abandoned, which is a continuation of application No. 10/360,955, filed on Jul. 2, 2003, now abandoned.

(51) Int. Cl.
*F25B 21/02* (2006.01)
(52) U.S. Cl. ............................. 62/3.2; 62/3.7
(58) Field of Classification Search .............. 62/3.2, 62/3.3, 3.4, 3.6, 3.7, 364, 3.64; 136/203, 136/204, 208
See application file for complete search history.

(56) References Cited

U.S. PATENT DOCUMENTS

| 4,238,759 | A |   | 12/1980 | Hunsperger |
|-----------|---|---|---------|------------|
| 5,079,618 | A |   | 1/1992  | Farnworth  |
| 5,166,777 | A |   | 11/1992 | Kataoka    |
| 5,188,286 | A |   | 2/1993  | Pence, IV  |
| 5,228,923 | A | * | 7/1993  | Hed ............................ 136/208 |
| 5,229,327 | A |   | 7/1993  | Farnworth  |
| 5,361,587 | A |   | 11/1994 | Hoffman    |
| 5,491,452 | A |   | 2/1996  | Ohtsubo et al. |
| 5,515,238 | A |   | 5/1996  | Fritz et al. |

(Continued)

FOREIGN PATENT DOCUMENTS

WO    WO 2004/038290    5/2004

(Continued)

*Primary Examiner*—Mohammad M Ali
(74) *Attorney, Agent, or Firm*—The Webb Law Firm

(57) ABSTRACT

New Peltier semiconductor heat transfer systems are presented herein. In particular, Peltier heat transfer systems of Peltier semiconductor elements of highly unique shapes are arranged to bias the cooling side with respect to its size and consequently performance. In effect, a Peltier heat transfer system is created whereby the Peltier called side is greatly reduced in size and the Peltier hot side is greatly expanded in size. Such 'high aspect ratio' Peltier systems promote 'focused' cooling effect, which is particularly useful in conjunction with high-performance electronic devices having a small footprint. The entire cooling fact of the Peltier device is brought to the small space approximated by a point. Thus a 'point' heat source such as a semiconductor laser are high-performance light emitting diode is more effectively cooled by these systems.

13 Claims, 12 Drawing Sheets

U.S. PATENT DOCUMENTS

| | | |
|---|---|---|
| 5,550,387 A | 8/1996 | Elsner et al. |
| 5,714,791 A | 2/1998 | Chi et al. |
| 5,841,064 A | 11/1998 | Maekawa et al. |
| 5,960,142 A | 9/1999 | Shimizu |
| 5,966,938 A | 10/1999 | Nagakubo et al. |
| 6,023,481 A | 2/2000 | Kuribayashi et al. |
| 6,067,802 A | 5/2000 | Alonso |
| 6,198,579 B1 * | 3/2001 | Rupp ......................... 359/820 |
| 6,219,364 B1 | 4/2001 | Dei |
| 6,236,810 B1 * | 5/2001 | Kadotani .................... 392/485 |
| 6,697,399 B2 | 2/2004 | Kimura et al. |
| 6,743,973 B2 | 6/2004 | Hayashi et al. |
| 6,744,110 B2 | 6/2004 | Sterzel et al. |
| 6,826,916 B2 | 12/2004 | Shimada et al. |
| 6,988,815 B1 * | 1/2006 | Rizkin et al. ................ 362/245 |
| 2002/0033189 A1 | 3/2002 | Macris |
| 2004/0120156 A1 | 6/2004 | Ryan |
| 2004/0190305 A1 | 9/2004 | Arik et al. |

FOREIGN PATENT DOCUMENTS

| | | |
|---|---|---|
| WO | WO 2004/084320 | 9/2004 |
| WO | WO 2004/095593 | 11/2004 |

* cited by examiner

PELTIER COOLING SYSTEMS WITH HIGH ASPECT RATIO

CROSS REFERENCE TO RELATED APPLICATIONS

This application is a continuation of U.S. patent application Ser. No. 11/316,178, filed Dec. 22, 2005; which is a Continuation of U.S. patent application Ser. No. 10/545,216 filed Aug. 4, 2005; which is a United States national phase application depending from PCT patent application No. PCT/EB2004/000202, filed Jan. 29, 2004, which benefits from priority established as U.S. application Ser. No. 10/360,955 filed Jul. 2, 2003, now abandoned, all of which are incorporated by reference in their entireties herein.

BACKGROUND OF THE INVENTION

1. Field of the Invention

The following invention disclosure is generally concerned with semiconductor cooling systems in high performance electronic devices and specifically concerned with Peltier semiconductor elements of non-rectilinear shapes arranged to provide a spatial concentration of the heat transfer effects.

2. Description of Related Art

U.S. patent application Ser. No. 2004/0120156 published on Jun. 24, 2004 by inventor Ryan of Riversdale, N.Y., teaches a high-powered lighting assembly, which includes an easily sealed continuous thermal barrier and a solid-state actively controlled closed loop refrigeration system to maximize operational efficiencies increase to unit life. A novel fanout arrangement of five rectilinear Peltier elements provides a nice heat spreading scheme coupled to an LED light source. In this way, the LED can operate at very high power, while the Peltier cooling system transfers heat out the back of the package, which includes a special insulation system. The systems presented by Ryan are highly effective in view of the fact that heat is generated in a small focused, point-like area.

U.S. patent application Ser. No. 2004/0190305 by Arik et al., also teaches an LED with active cooling systems. In this case, fluid, such as water, draws heat away from the LED and transfers it to a dissipating structure.

Heat dissipating silicate-on-insulator structures are presented by inventor Marcis in U.S. patent application Ser. No. 2002/0033189 of Mar. 21, 2002. In some of the systems a radial fanout of silicate-on-insulator pieces formed a heat transfer system having a concentrated cold area at a device center. However, as a device is purely two-dimensional in nature, that is the heat dissipating area is completely within a single plane, it is a necessary condition that the hot area is similar in size to the cold area, although somewhat larger.

Inventors Shimada et al., teaches in U.S. Pat. No. 6,826,916, a "laser module, Peltier module, and Peltier module integrated heat spreader". The laser module is a high-performance electronic device which generates a significant amount of heat. The laser performance would be improved if it were possible to draw heat quickly away from the laser. As such, Shimada et al., has integrated a Peltier heat transfer system with the laser module. The laser module may be considered a point-type heat source. As such, the Peltier module configuration is arranged to cooperate with such point-type heat sources, as it is tightly thermally coupled thereto.

Kimura et al. are inventors of semiconductor laser modules having Peltier heat transfer systems which regulate laser temperature. In U.S. Pat. No. 6,697,399 entitled "Semiconductor Laser Module with Peltier Module for Regulating a Temperature of a Semiconductor Laser Chip", a high-performance electronic device, namely a laser, is integrated with a Peltier heat transfer system. The system in Kimura et al. illustrates a primary deficiency found throughout the art that the use of rectilinear Peltier elements to cool point-type heat sources is inefficient at best, because the "cold side" is embodied as a plane which occupies an extensive area while heat production occurs at a very tiny point. It is very hard to effectively couple a large planar surface to a point-type heat source as the coupling's efficiency depends on thermal conduction in the cold plane. Kimura et al. systems would be greatly improved if the cold generating means were more tightly focused, and in closer contact with the laser device.

In U.S. Pat. No. 6,219,364 inventor Dei teaches a semiconductor laser module having improved metal substrate on Peltier element. The "metal substrate on Peltier element" is designed to better couple the point-type heat source to the large plane of the Peltier heat transfer system. Particular attention is drawn to FIG. 7 which describes a heat flow pattern in three dimensions (labeled as X in the drawing). One will note that the cold plane 11A is stood off far away from the heat source laser 1; for this reason, Dei depends on a complex structure to pass heat from the laser to the large cold plane. While Dei tries to promote a most effective coupling between the point-type heat source and the large cold plane of the Peltier heat transfer system, it would be highly desirable if the cold plane were better suited and configured to more directly address the natural geometry of the heat source.

The invention designs of Nagakubo et al. in U.S. Pat. No. 5,966,938 are directed to Peltier control circuits and Peltier device structure. Of particular interest, is the Peltier device structure detailed in FIG. 2. It is clear that a plurality of rectilinear Peltier device elements separate a cold plane from a hot plane in the traditional Peltier heat transfer system configurations. A detailed further investigation of these systems will yield no particular effort to arrange heat producing sources in conjunction with localized cold spots which may exist on the cold plane.

While systems and inventions of the art are designed to achieve particular goals and objectives, some of those being no less than remarkable, these inventions have limitations which prevent their use in new ways now possible. Inventions of the art are not used and cannot be used to realize the advantages and objectives of the inventions taught herewith.

It should be understood that all of the herein referenced materials provide considerable definition of elements of these newly presented inventions. Therefore, those materials are incorporated herein by reference whereby the instant specification can rely upon them for enablement of the particular teachings of each.

SUMMARY OF THE INVENTION

Abramov, V.S.; Ivanov, A.A.; Shishov, A.V.; Sherbakov, N.V.; and Sushkov, V.P., have inventions of Peltier effect cooling systems having a high aspect ratio with respect to its hot and cold sides. These inventions include devices configured in conjunction with high performance electronic elements characterized as having a very small footprint. In some most preferred versions, these systems include a Peltier heat transfer system having a spatial bias in conjunction with a plurality of LEDs arranged in an array.

It is a primary function of these Peltier cooling systems to provide highly concentrated cooling effect to size limited devices and geometries. It is a contrast to prior art methods and devices that those systems do not provide a significant size difference between hot and cold areas. A fundamental difference between Peltier cooling systems of these inventions and those of the art can be found when considering the ratios between the heating areas and the cooling areas.

Peltier elements of special geometric shape and design are arranged to provide a 'focused' or concentrated cooling effect and deliver that cooling mechanism to a very small size and geometry. In this manner, point-type heat sources, such as high-performance electronic devices; for example, a laser, high output or otherwise high-performance LED, may be more effectively cooled as the cooling capacity of these Peltier heat transfer systems is more directly coupled to such devices in view of their intrinsic geometry.

Peltier elements of these inventions are sometimes configured in non-rectilinear, non-cylindrical arrangements. More particularly, Peltier elements of these inventions are configured as three-dimensional shaped elements, which provide considerable leverage with respect to spatial advantages. When properly arranged, these Peltier elements deliver cooling to a size limited space and geometry, but, at the same time, provide heat dissipation to a considerably larger three-dimensional space. It is not unusual to have "hot side" to "cold side" ratios greater than 3. It is entirely possible to provide a hot side ratio greater than 10.

When used in combination with high-performance LEDs, these three-dimensional Peltier heat transfer systems deliver the highest cooling effect to the LED junction, which permits these high-performance LEDs to be driven with greater currents and, thus, at higher optical outputs. Thus, these three-dimensional Peltier heat transfer systems, when used in combination with high-performance electronic devices having a point-type heat source profile, always permit better performance.

It is a primary objective of these inventions to provide Peltier cooling systems arranged with a spatial bias with respect to the hot and cold sides.

It is an objective of these inventions to provide Peltier cooling systems having a cold side which is smaller than a hot side.

It is a further objective to provide Peltier cooling systems having a cold side smaller than a hot side in conjunction with a high performance electronic element with a small footprint.

It is further an objective to provide array arrangements of Peltier systems having hot side/cold side ratio of greater than 2.

A better understanding can be had with reference to a detailed description of preferred embodiments and with reference to appended drawings. Embodiments presented are particular ways to realize these inventions and are not inclusive of all possible ways. Therefore, there may exist embodiments that do not deviate from the spirit and scope of this disclosure as set forth by the claims, but do not appear here as specific examples. It will be appreciated that a great plurality of alternative versions are possible.

BRIEF DESCRIPTION OF THE DRAWINGS

These and other features, aspects and advantages of the present invention will become better understood with regard to the following description, claims and drawings where:

GLOSSARY OF SPECIAL TERMS

Figure 1:
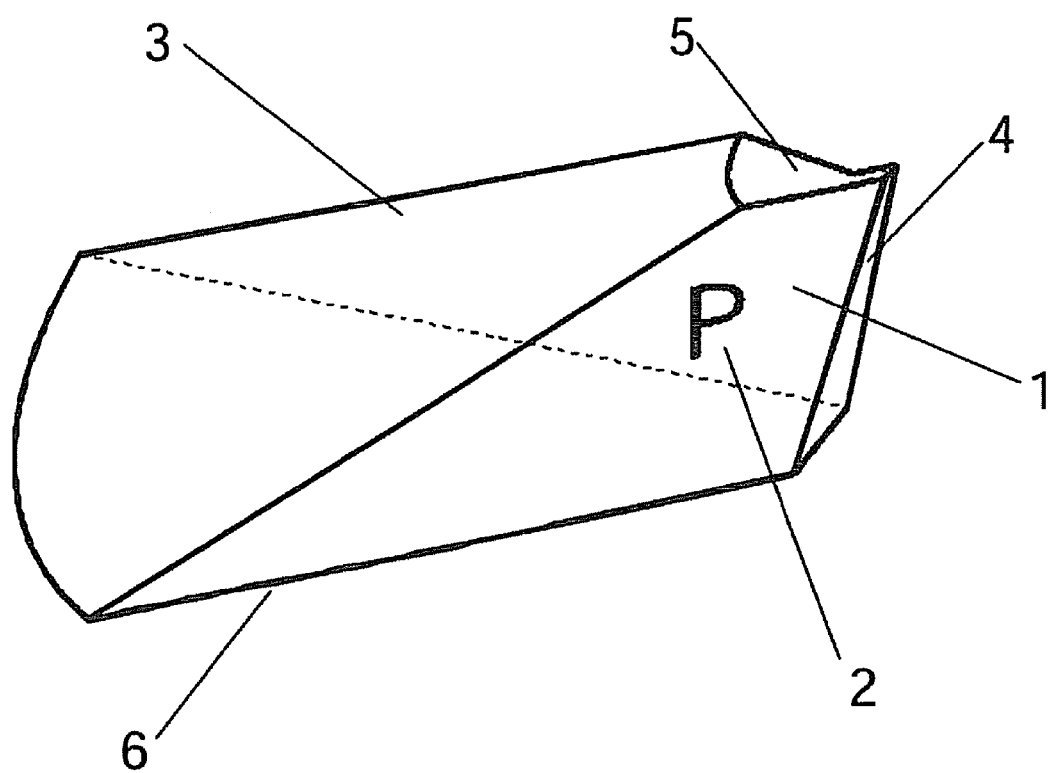
FIG. 1 is a perspective diagram of a semiconductor element of complex non-cylindrical, non-rectilinear shape.

Throughout this disclosure, reference is made to some terms which may or may not be exactly defined in popular dictionaries as they are defined here. To provide a more precise disclosure, the following terms are presented with a view to clarity so that the true breadth and scope may be more readily appreciated. Although every attempt is made to be precise and thorough, it is a necessary condition that not all meanings associated with each term can be completely set forth. Accordingly, each term is intended to also include its common meaning which may be derived from general usage within the pertinent arts or by dictionary meaning. Where the presented definition is in conflict with a dictionary or arts definition, one must consider the context of use and liberal discretion to arrive at an intended meaning. One will be well advised to error on the side of attaching broader meanings to terms used in order to fully appreciate the depth of the teaching and to understand all the intended variations.

Heat Sink. A heat sink is any system into which heat may be dissipated. These include mechanical systems, such as bulk material of high thermal capacity promoting heat transfer via conduction. Alternatively, these include systems such as cooling fins in air currents which promote heat transfer via convection and radiation.

Active Area. An 'active area' is a geometric construction, including a place in which a point-type heat source may be accommodated. An active area of these inventions is coupled to a cold side of a Peltier heat transfer system.

High Performance Electronic Device. High performance electronic devices herein are devices which generate significant amounts of heat detrimental to their performance. The efficacy of such devices becomes compromised without active cooling. Thus, a high performance electronic device is one which benefits from a cooling system operable for taking heat away from the device. For these inventions, a high performance electronic device is a heat producing system of small footprint; i.e. a point-type heat source.

'hot side' and 'cold side'. Use of terms 'hot side' and 'cold side' might otherwise seem to imply a planar structure, however, this notion is hereby explicitly rejected. For purposes of these inventions, a 'hot side' or 'cold side' may be drawn to structures not necessarily planar in nature. Cold sides tend to approximate a point structure or a structure including a group of point approximations. A hot side may be planar or may include a structure such as a cylinder. These may include cylinders of circular section. Accordingly, it would be a mistake to associate any particular geometry to the term 'side' unless particular geometry is explicitly set forth.

BRIEF DESCRIPTION OF THE INVENTION

In accordance with each of preferred embodiments of this invention, there is provided asymmetric Peltier heat transfer systems where the asymmetry is a spatial arrangement which favors the cold side of the system being smaller in size than the hot side. This is achieved by providing Peltier elements of remarkable and unusual shapes in comparison to those which may be found in the art. Typically, Peltier elements are grown as crystals and are nearly invariably formed as cubes or at least rectangular-cylindrical in shape. In the spatial devices first presented herein, Peltier elements are fashioned from bulk material into shapes which are not rectangular-cylindrical.

It will be appreciated that each of the embodiments described include an apparatus and that the apparatus of one preferred embodiment may be different than the apparatus of another embodiment.

Peltier cooling systems are typically comprised of alternately doped semiconductor elements. These semiconductor elements are formed from bulk semiconductor material grown as a crystal. Peltier semiconductor elements are typically formed in rectangular shapes having six orthonormal sides. Peltier heat transfer systems of the art are generally comprised of many of these rectangular-cylindrically shaped pieces formed in an array between a hot plane in a cold plane.

Despite that fact, it remains possible to form semiconductor elements into complex shapes. Indeed cleaving, grinding, etching or otherwise shaping semiconductor devices to desired shapes, can produce "unnaturally shaped" crystal structures. In the following description, semiconductor elements of shapes having at least two opposing sides which are not parallel are proposed. These crystals may be formed in various ways, and by various procedures, but in the end, it is the new geometric shapes proposed herein, which provide foundation for these inventions.

With reference to the drawing figures, one will gain a more complete understanding of these inventions. In particular, with reference to FIG. 1, attention is directed to important parts of a single Peltier semiconductor element. First, one is reminded that a Peltier element is merely a semiconductor bulk material having been doped with an appropriate dopant, either a 'P'-type dopant or a 'N'-type dopant. The bulk material 1 may be grown in a crystal growing process which permits a dopant to be introduced to the crystal lattice to form a semiconductor of 'P' or 'N'-type dopants. In the drawing figure, we indicate the bulk material as 'P'-type 2 with the designator letter 'P'. In these very spatial Peltier elements of non-rectilinear shapes, or 'shaped Peltier elements' one may find geometric features such as a sloped wall 3, which is anti-parallel with respect to opposing side 4, such construction cannot be found in Peltier systems of the arts. Peltier elements are typically grown in the art as crystals structures in cubic form having six orthonormal sides, each being a rectangle, each having an opposing side parallel therewith. The various sides of such devices are characterized in that they are perpendicular with respect to each other.

In devices first presented herein, we not only consider Peltier elements where the sides are not orthonormal, but also we consider sides having peripheries which are non-rectangular polygons. For illustration purposes, the Peltier element of FIG. 1 is shown with a complex shaped top side periphery 4. The shape may be necessary to support some special device function called for by a particular application. For example, such spatially shaped periphery may cooperate with the footprint of a particular device which is arranged to receive the cooling benefit. In striking contrast, application of Peltier elements in the arts generally do not require elements having sides with shaped peripheries, or elements having non-orthonormal sides.

While these spatially shaped Peltier elements may include sides of complex shapes and sizes, they behave like common Peltier elements in that they have a 'cold side' and a 'hot side', depending upon the relationship the element has with its electrical connectors/conductors and the direction of electrical current which is passed therethrough. In FIG. 1, a cold side may be arranged as the top side 5, and the hot side may be arranged as the bottom side 6. One will appreciate that the top side is considerably smaller in area than the bottom side. It is entirely possible that the top side is $\frac{1}{10}$ or less the area of the bottom side, building an important cooling "magnification" or "concentrating" effect. This will prove to be a very important aspect of the following arrangements.

It is shown herein to be sometimes advantageous to 'focus' the heat transfer properties of Peltier systems to a very small area. For example, where a system to be cooled has a very small footprint or point geometry. In the invention presented herein, the heat transfer mechanisms of Peltier elements are concentrated or 'focused' via these complex shapes used to form the Peltier elements. In the example shown as FIG. 1, the entire ability of this Peltier element to cool is concentrated into the small area of the top side 5, while the entire ability of this Peltier element to dissipate heat, is spread to the large area of the bottom side 6. This high aspect ratio of hot side to cold side, has previously not been seen in conjunction with Peltier heat transfer systems.

When the nature of the object to be cooled is characterized by a point-type heat source, then it is a great advantage to form a Peltier cooling system having a cold side of limited spatial extent.

Figure 2:
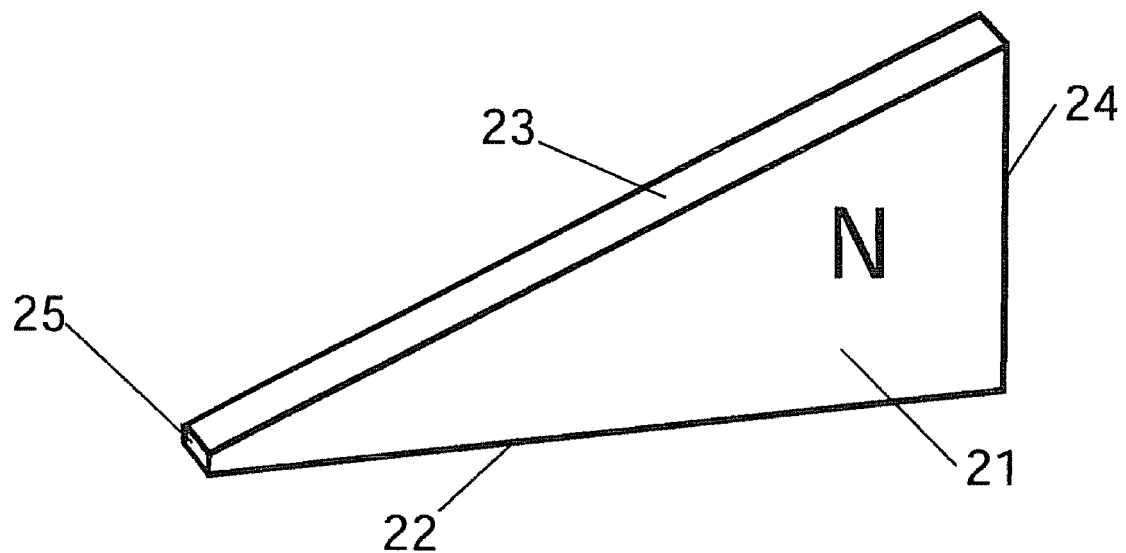
FIG. 2 illustrates a spatial Peltier element in a three-dimensional pie-wedge shaped.

A very important pie-wedge shaped Peltier element 21 is shown as FIG. 2. When pie-wedge shaped semiconductors are arranged in an appropriate electrical circuit and current is passed therethrough, the Peltier elements cause heat transfer from a first side to a second side.

In particular, the pie-wedge example of the FIG. 2 is comprised of six sides. Two sides, one indicated as 21 (its compliment is neither visible nor labeled in the diagram), have an area considerably larger than the area of all other sides. These two sides may be parallel to each other. We refer to those as facing sides or sides which oppose each other. Underside 22, and its compliment, topside 23, have rectangular periphery; however, these sides are not parallel with respect to each other, but rather are askew. 'Backside' 24 and 'tip' 25 are configured and arranged as junction sides. A metal contact and electrical conductor is joined at these sides to form a Peltier junction between semiconductor and conductor. These contacts bring about the Peltier cooling and heating, depending upon current direction and semiconductor type ('P'-type or 'N'-type). If the current is properly directed, then the backside 24 will have the Peltier heating and the tip will present Peltier cooling.

Experts will appreciate that every electron of the current, when passing from a conductor to a semiconductor, or vice versa, contributes to heating or cooling in the junction where the transition takes place. Accordingly, if all the current is forced into a small area junction all the heating or cooling will occur in that limited area. It is therefore easy to understand how the entire cooling capacity of a Peltier device might be forced to occur in a small area. If a conductor/semiconductor junction is formed in a small area, the current is forced to pass that junction and deliver the cooling process locally. In the Peltier element of FIG. 2, the entire cooling capacity can be delivered to the area associated with the small face 25.

One will appreciate that in preferred versions, hot ends are appreciably larger in area than said cold ends. Since the entire current will pass that very limited area, i.e. the junction where a metal contact is applied, each electron will contribute to the cooling effect as it looses its energy traversing the junction. When properly configured in a heat transfer system, each Peltier element has a cold side and a hot side. In best arrangements, pairs of Peltier elements are arranged to form a portion of a serial electronic circuit, and at the same time, a portion of a parallel thermal circuit.

It is not necessary that the junction be on a single surface, but rather might take up a shape not in a single plane. For example, it is possible to arrange a connector which connects to a small portion of the surface indicated as 22 and the entire surface indicated as 25. Thus, an 'L'-shaped connector might be suitable to define the 'cold side' of these shaped Peltier elements. Experts will appreciate that there is nothing sacred about a 'cold side' being a planar surface. What is strictly called the 'cold side' or 'hot side' of Peltier systems may be embodied in this invention as something which does not resemble the literal meaning of 'side' at all; but rather is a complex shaped surface or structure. For these Peltier systems where a metal conductor contacts a Peltier element surface of any shape, the portion were the Peltier material and metal conductor join together defines the 'cold side' or 'hot side'.

It is now clear that old Peltier device terminology 'side' does not apply well to the three-dimensional devices presented in this disclosure, it is useful to present further description as to precisely what makes up the nature of a cold side of these unique systems. Since these systems are primarily directed to accommodate heat generating electrical elements having a small footprint, we sometimes refer to these heat producing sources as 'point-type' sources. As such, our 'cold sides' are sometimes arranged to cooperate with a geometric point. While a geometric point is unaddressable in real physical systems having finite extent, one will appreciate that small circular areas, surfaces and spaces will sometimes be liberally considered herein 'a point'. To better understand how the uniquely shaped Peltier element of FIG. 2 is used in conjunction with additional similarly shaped Peltier elements to cooperate together and address an area of limited size, one should consider the illustration of FIG. 3. Those skilled in the art are reminded that Peltier elements are preferably used in pairs, or sometimes in groups, or groups of pairs. We extend the example to illustrate how a plurality of the Peltier elements first presented in FIG. 2 operates in conjunction with others to form a compound system with shared objective.

Figure 3:
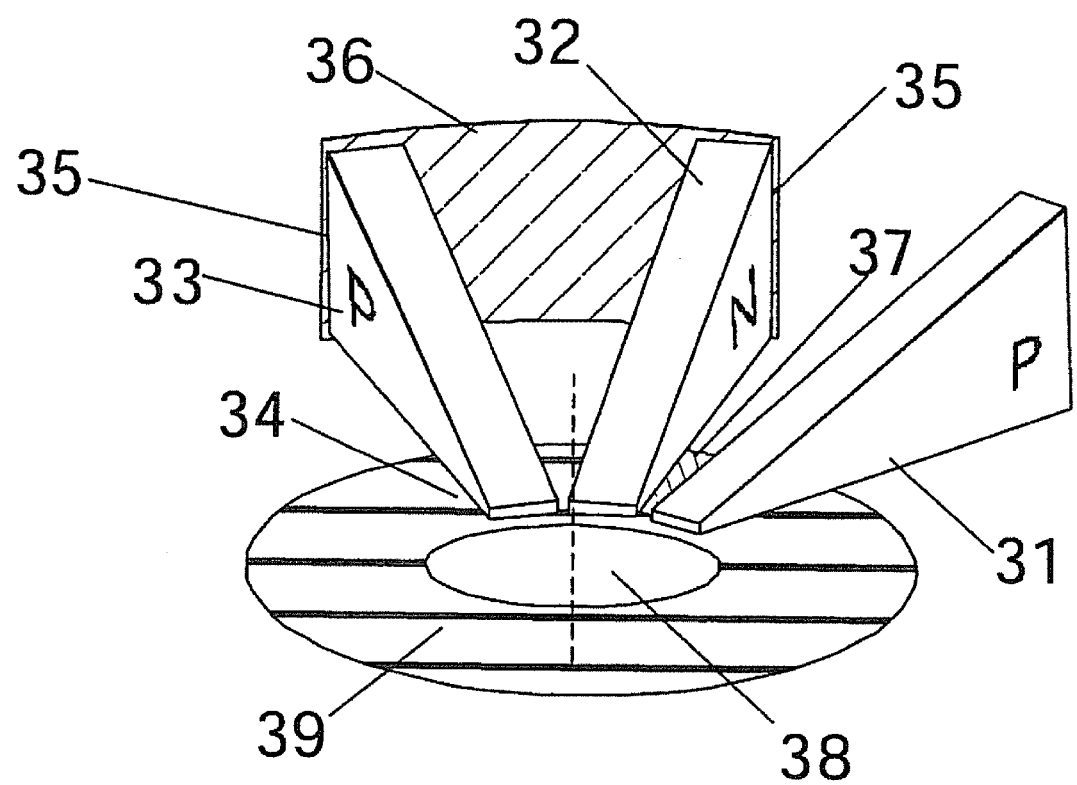
FIG. 3 is a perspective drawing of several pie-wedge shaped Peltier elements and the spatial relationships with their neighbors.

With regard to FIG. 3, those skilled in the art will immediately notice an unusual arrangement of Peltier elements and electrical interconnections therebetween. The arrangement of Peltier elements presented occupies a three-dimensional volume of highly unique geometry totally unknown prior to this disclosure. In particular, a first Peltier element 31 (a 'P'-type semiconductor Peltier element) is arranged in a radially-outward extending fashion with reference to a symmetry axis. Further, a second Peltier element (a 'N'-type Peltier element 32) similarly extends outwardly from a symmetry axis. Still further, Peltier element 33 (another 'P'-type Peltier element) also extends radially outward from the same symmetry axis.

With attention directed to Peltier element 33, careful consideration should be directed to the underside. In particular, an approximately ⅓ portion of the underside which is closest to the foreground in the drawing. If one were to arrange an electrical conductor to join on this forward portion of the Peltier element, all Peltier cooling activity would occur at the junction of the metal conductor and the Peltier element in the forward area as described.

Peltier heating would occur where a second conductor is joined with the Peltier element to form a 'hot side' at backside surface 35. Casual inspection will reveal that, in fact, the conductor 36 which joins two Peltier elements together would not resemble a 'side' at all in the traditional sense, but rather, for these devices 'sides' would be cylindrical sections. In this way, it is possible for current to flow from a first Peltier element, through the cylindrically shaped conductor, and into the second Peltier element. Peltier heating would occur at both junctions where the conductor interfaces with either Peltier element. Indeed, the area over which Peltier heating occurs can be made to be quite large.

Close examination will reveal another conductor 37 between two other Peltier elements (Peltier elements 31 and 32). This conductor similarly forms junctions of metal and Peltier bulk material at one 'N'-type element and one 'P'-type element. As explained previously, current may pass from a first Peltier element, through the Peltier-metal junction, causing Peltier cooling, further into the metal conductor and toward a second Peltier element, through the metal-Peltier junction further causing additional Peltier cooling, and finally into the second Peltier element. It is now quite easy to appreciate that a serial electronic circuit is formed by this arrangement; i.e., electrical current may pass from Peltier element 31, through a cold side conductor 37, into Peltier element 32, through hot side conductor 36, and finally into Peltier element 33. Those skilled in the art will further note that the arrangement promotes a very interesting parallel thermal circuit. Active area 38 is thermally coupled by way of proximity to metal conductor 37, and further to Peltier elements at their apex. In some preferred versions, the hot area is substantially concentric with the active area.

Drawing area designated as 39 includes the active area into which cooling service may be delivered and Peltier cold side which is a generally circular area defined by the group of conductors arranged about the Peltier element apex.

Thus, this highly unique and untraditional arrangement of Peltier elements shares the necessary features of all Peltier heat transfer systems that are a serial electronic circuit and parallel thermal circuit.

Extension of this concept, such that a plurality of Peltier elements completely surround circular 'active area' 38, yields a highly functional heat transfer system particularly suitable for cooling a point-type heat generating source or high-performance electronic element. In this way, an active area is thermally coupled to the cold ends of a plurality of Peltier semiconductor elements.

Figure 4:
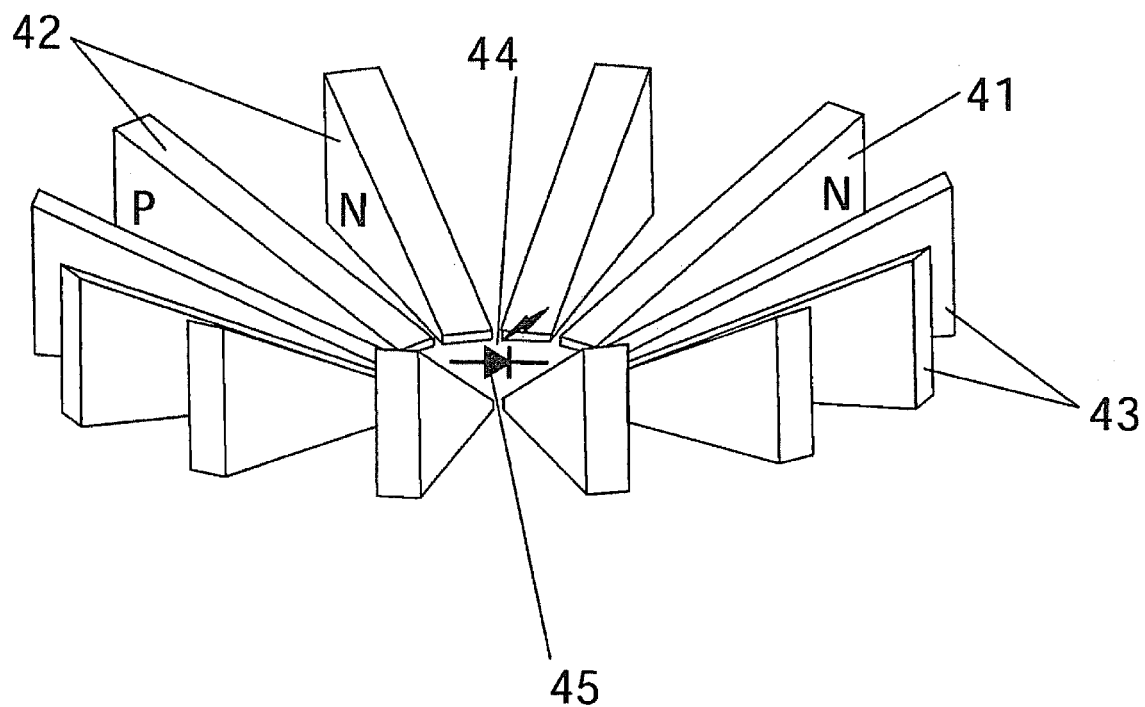
FIG. 4 is a similar perspective drawing of a complete set of pie wedge shaped Peltier elements distributed in a radially symmetric arrangement.

Such system becomes immediately clearer in view of FIG. 4, which presents additional Peltier elements in cooperation with each other to provide cooling to a point. A special radial arrangement of six 'N'-type and six 'P'-type Peltier elements as shown in FIG. 4. In detail, 'N'-type Peltier element 41 is a pie-wedge shaped element having a relatively small apex end and a larger backside end. To compliment the N'-type Peltier element, a 'P'-type Peltier element cooperates therewith, thus forming a Peltier pair 42 and 43. Pairing elements in this fashion helps facilitate the serial electronic circuit and connector design. While FIG. 4 is drawn to a particular important example, it does not take an extensive imagination to realize that it is not necessary to pair Peltier elements in this fashion, rather it is possible to put all 'N'-type Peltier elements on one side and all 'P'-type Peltier elements on the other side, with some spatial arrangement of connectors to join them into a serial electronic circuit accordingly. Such arrangements are not considered deviation from the spirit and essence of this invention, the scope of which can be readily ascertained by the claims of this specification.

Attention is now drawn to the center region of this device. A circular region at the center is fashioned as an active area 44. The active area is configured whereby a high-performance electronic device may be affixed or otherwise coupled thereto. This coupling preferably includes thermal consideration which passes thermal energy from a high-performance electronic device 45 into the substrate from which the active area may be comprised. The active area may be coupled to the Peltier elements by mere proximity. The active area may join the Peltier elements by way of metallic conductors which may be formed on a same substrate from which an active area is made. The high-performance electronic device can be electrically insulated from Peltier elements but can be included in series electrical circuits with Peltier elements.

It is important for a full understanding of the invention to describe the novel electrical conductors which may be found in these Peltier heat transfer systems. These conductors are notably distinct and cannot be found in the prior art. For example, in consideration of the devices presented in FIGS. 3 and 4, one will appreciate that the 'cold side', which is defined by the regions where conductors and Peltier elements are joined, and where Peltier effect cooling takes place, is comprised of six annular sections each part of a common annulus. The center of this configuration is the active area into which a heat source might be placed. The coupling between the active area and 'cold side' may be via a high-heat conductive medium which may be the substrate upon which the device is fabricated. It is possible to provide a thermally conductive medium suitable for supporting an electronic heat producing element and the conductors which partly join Peltier elements into a serial circuit.

Figure 5:
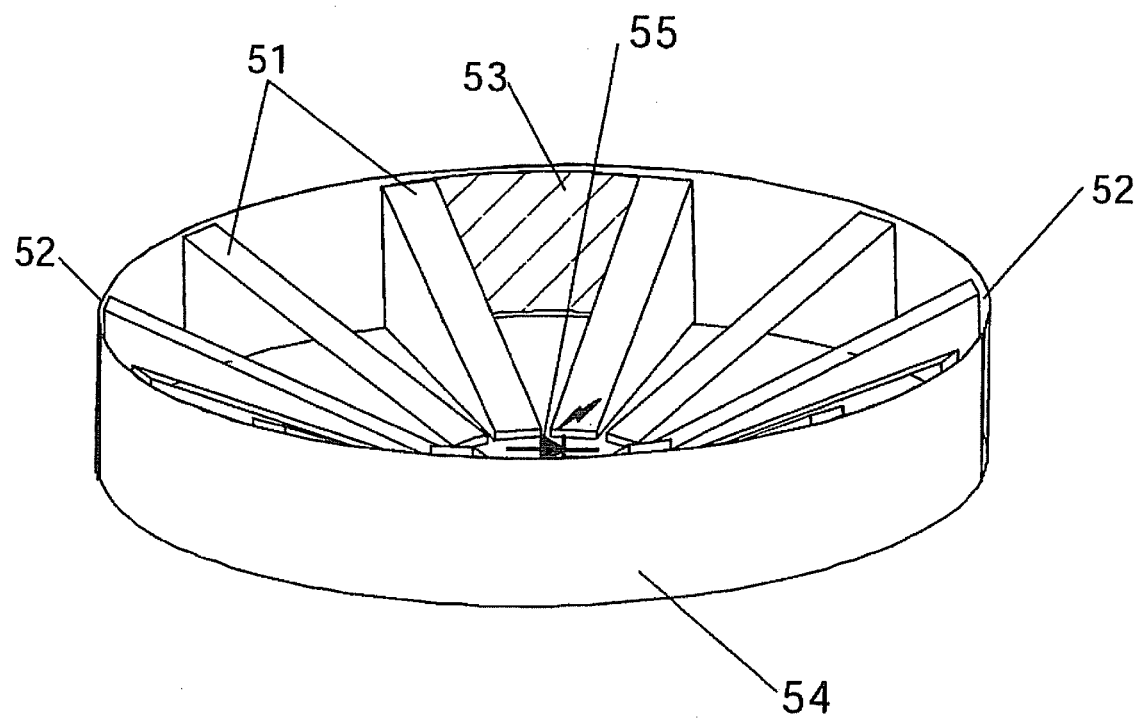
FIG. 5 is a perspective drawing of a radially arranged system of a plurality of spatial Peltier elements in conjunction with a cylindrical heat sink.

FIG. 5 suggests an important version of the heat dissipating means. Conductors which join Peltier pairs at the backsides are cylindrical sections. It is noted that one continuous conductor would upset the serial nature of an electronic circuit. Accordingly, the plurality of conductors which make up connections between Peltier pairs may all be put into thermal contact with a single cylindrical element which serves as a heat dissipating means or heat sink. While the conductors are in thermal contact with the single cylindrical element it is not the case that they necessarily be in electrical contact. The cylindrical element may be fashioned as a thermal conductor, but an electrical insulator. In the FIG. 5, Peltier pairs 51 are joined at their backside 52 to conductor 53 which passes heat into cylindrical element 54 having high thermal conductivity. Heat generated at high-performance electronic device 55 passes from the active area into the Peltier heat transfer system cold side, further into Peltier elements, still further into hot side conductors and finally into cylindrically-shaped heat sink.

While various interesting configurations may be devised from materials commonly used in the fabrication of electronic systems, the true essence of these inventions lies not in these configurations, but rather in the notion that a cold side is fashioned to cooperate with a small footprint point source by way of shaped Peltier elements which have a cold side considerably smaller in surface area than a hot side.

While it is suggested in these examples that a high-performance electronic device be a laser or high output light emitting diode, etc., it is easy to appreciate that many heat generating elements might benefit from heat transfer systems of the type first presented herein. In accordance with the particular geometries shown, it is easy to appreciate that any heat producing source which has a 'small footprint', that is to say occupies a small area, will benefit from such heat transfer systems. Because the systems are arranged to concentrate the cooling activity into a very small area, point sources are more effectively coupled to the entire cooling portion of the Peltier heat transfer system. Competing Peltier heat transfer systems rarely, or never, have cooling activity concentrated into a small space or area.

The system shown in FIGS. 4 and 5 is a best mode preferred example of a high-performance Peltier system which concentrates the cooling effect into a reduced size area. However, it is not the limit of systems possible. Indeed, a great many alternative versions are fully anticipated. These will become readily apparent to designers of such systems while maintaining a single essential principle: that is Peltier elements configured in three-dimensional shapes characterized as having non-orthonormal sides and/or sides having peripheries which are non-rectangular. In this way, it is possible to fashion a Peltier element with a cold side far smaller in area than its hot side.

While it is a preferred case that these systems be arranged in conjunction with a 'point' type heat source, there are other configurations of great interest. Namely, it is possible to address arrays of high-performance electronic elements with specially configured Peltier systems which concentrate the cooling effect to a plurality of distributed limited areas.

Figure 6A:
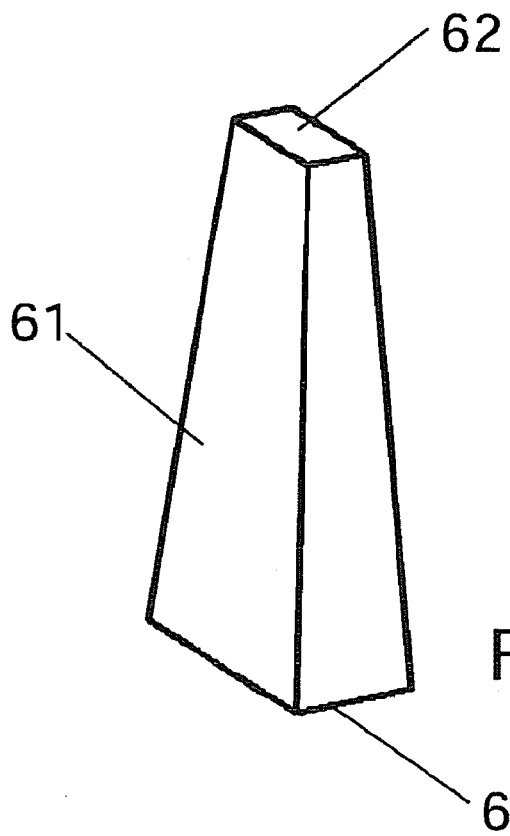
FIGS. 6A and 6B are perspective drawings of similar three-dimensional non-cylindrical, non-orthonormal, Peltier elements of different aspect ratio.
Figure 6B:
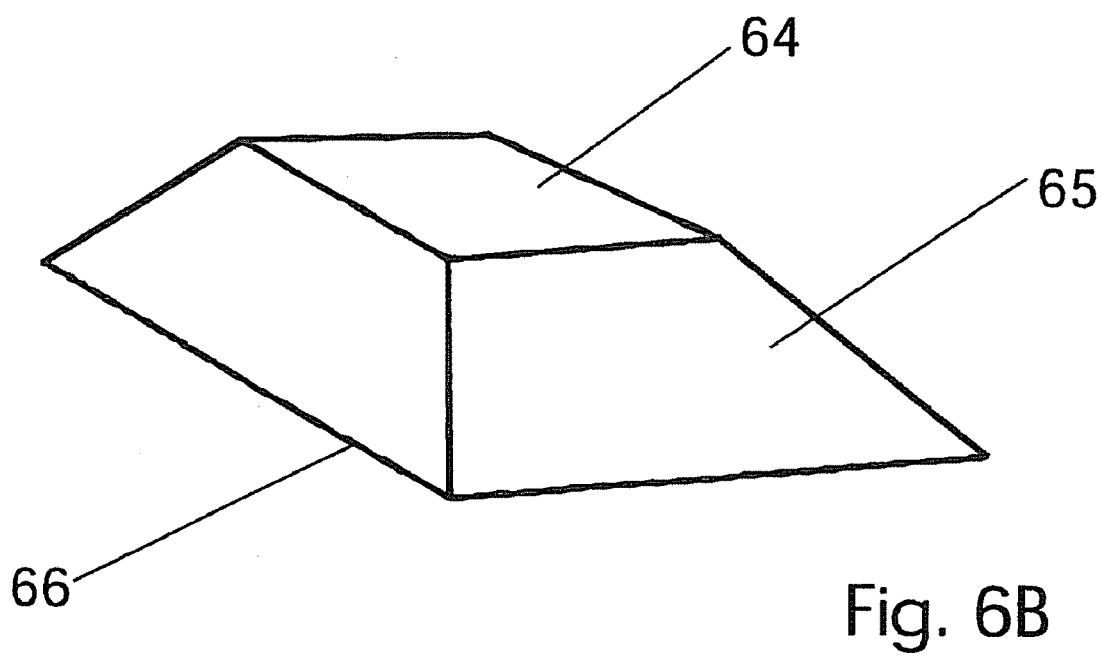

To more completely understand this, attention should be directed to FIGS. 6A and 6B which depicts one preferred shaped Peltier element 61. Of primary importance, one side 62 of the Peltier elements is fashioned with a small surface area. Additionally, an opposing side is fashioned with a large surface area. When properly combined with suitable connectors, such a Peltier element promotes aggressive cooling at the small area and efficient heat dissipation at the large area 63. One will appreciate that the aspect ratio shown in the figure is not special, but rather, an infinite number of alternative aspect ratios may work suitably well. FIG. 6B illustrates an alternative device where Peltier element 65 is short and squat with a small surface cold side 64 not far from a large surface hot side 66.

Figure 7:
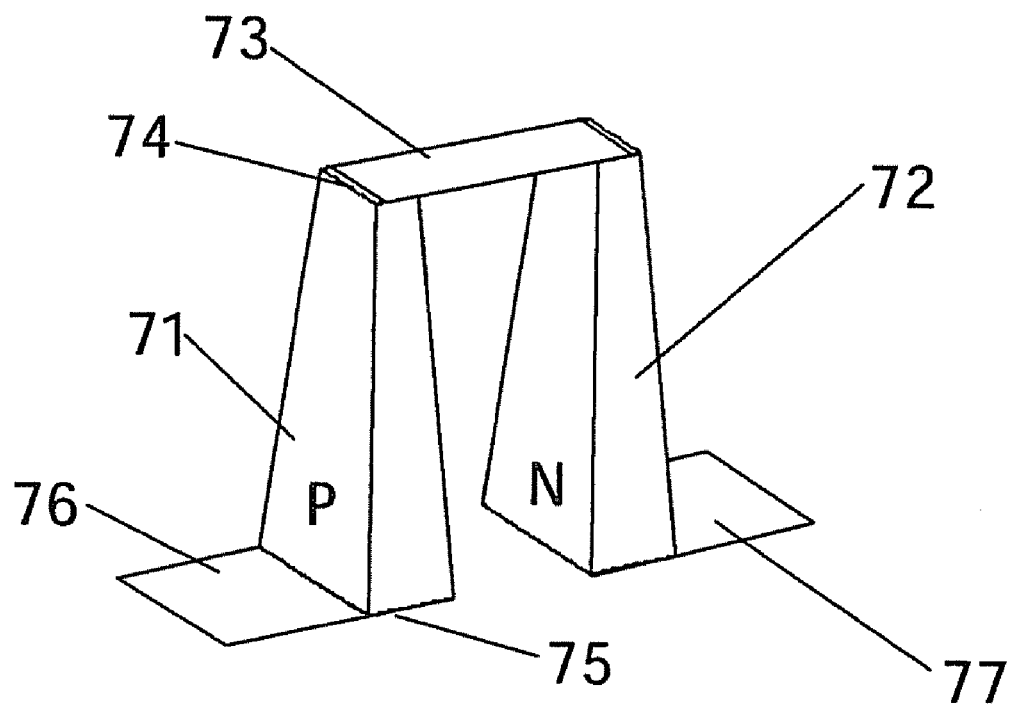
FIG. 7 is a drawing of two of these Peltier elements and their relationship in a serial electronic circuit.

To couple two such Peltier elements together forming a serial electronic circuit, one need apply a metal conductor as shown in FIG. 7. A first Peltier element 71, a 'P'-type Peltier element is coupled with an 'N'-type Peltier element 72. They are joined together by metallic conductor 73 which forms a junction 74, and therefore, the cold side of the device. Another junction 75 is formed at the bottom large area side of the 'P'-type Peltier element to yield the device hot side. Metal strip connectors 76 and 77 may further be connected to additional Peltier pairs to form a single electronic circuit and device which operates as one.

Figure 8:
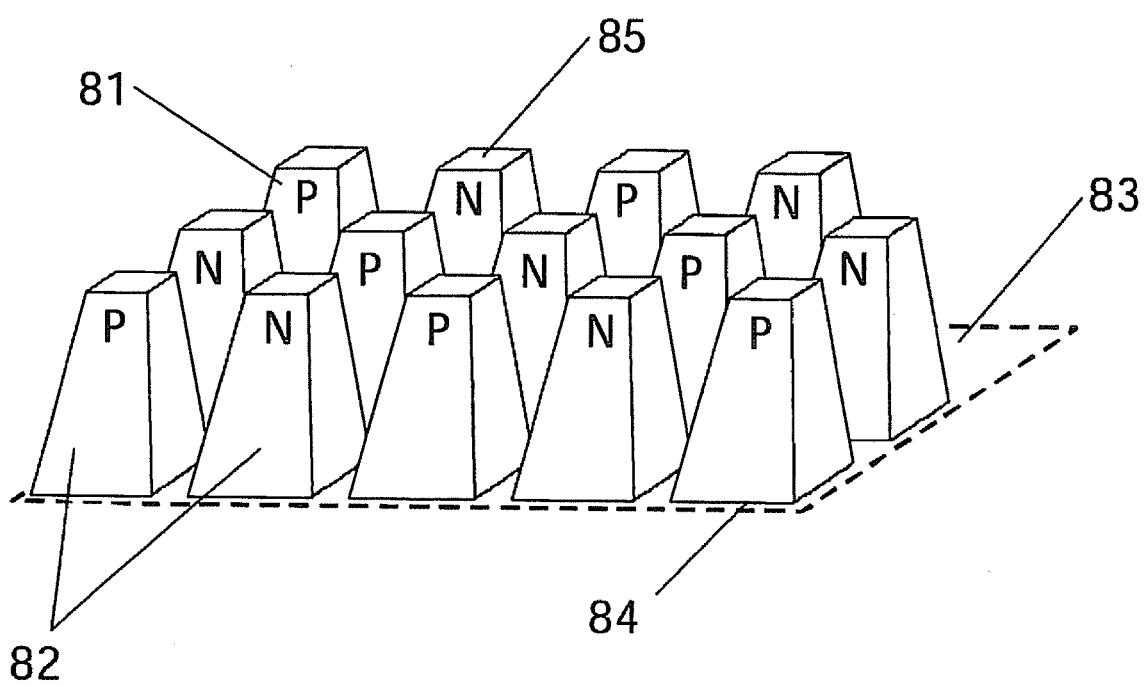
FIG. 8 is a perspective drawing of a spatial array of Peltier elements each having a spatial three-dimensional shape.
Figure 9:
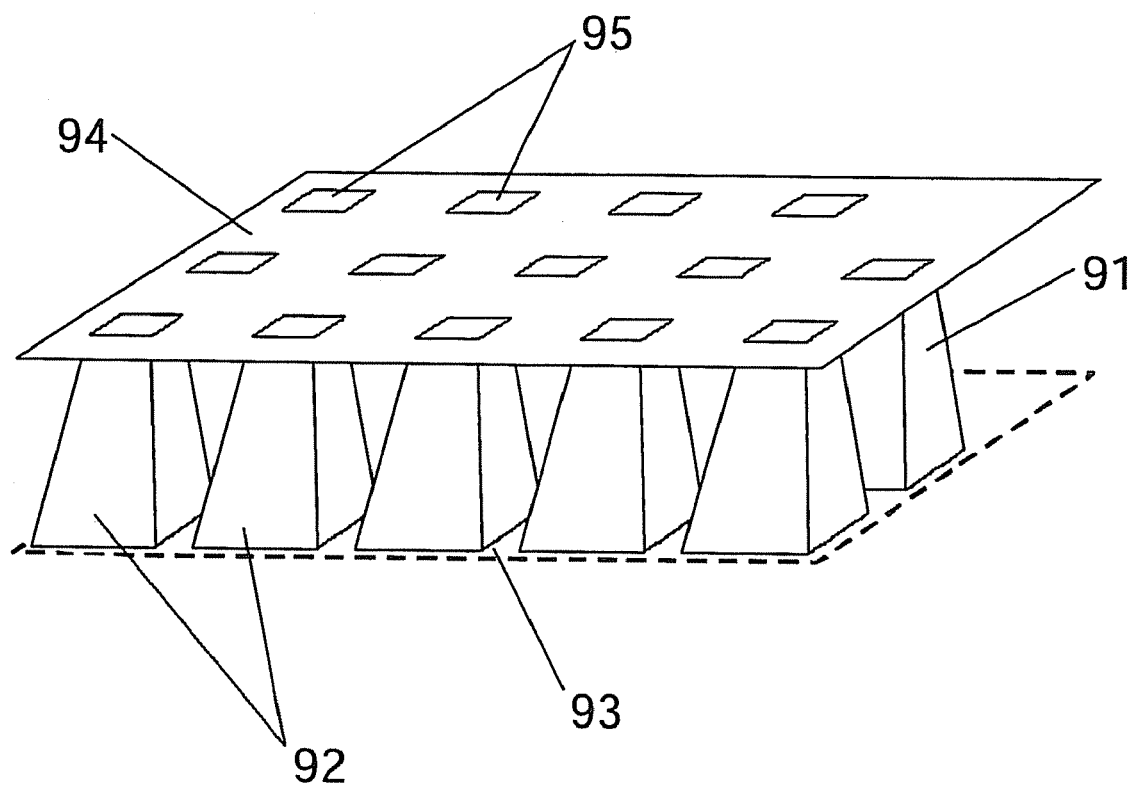
FIG. 9 is a perspective drawing of the same array further illustrating an important cold plane with concentrated or 'focused' cold areas.

FIG. 8 illustrates real advantages in forming Peltier elements as described in FIGS. 6 and 7. Individual Peltier elements 81 may be distributed in pairs 82 side-by-side, 'P'-type next 'N'-type, over a large plane 83. A large area side of each of these Peltier elements will become the hot side or heat dissipating portion of the device. This occurs because the Peltier element is joined at the 'hot plane' to form a semiconductor/conductor interface 84. Conversely the top side 85 of the Peltier elements, a side having an area significantly smaller than the area of the hot side, does not appreciably cover the entire top plane or 'cold plane'. Indeed, only 50% or less of the top plane could be comprised of conductor/semiconductor junctions due to the limited size of the semiconductor tops. This is more easily visualized in view of FIG. 9 which shows the cold plane in greater detail. Peltier element 91 and Peltier element pairs 92 separate the hot plane 93 from the cold plane 94. Only limited portions of the cold plane have active cooling function associated therewith. The reader is reminded that cooling only takes place, where electrical current transfers to/from a metal connector from/to a semiconductor element. Thus, these distributed select 'cold spots' 95 are well suited to receive therein, an individual high-performance electronic device or other heat source. In striking contrast to the prior art systems, in those devices it is preferred that any physical implementation of a cold plane include the substrate having a low thermal conductivity. In this way, cold spots tend to stay colder and heat from surrounding elements tends to pass through the system and to the hot plane, rather than migrating to an adjacent device. As such, electronic elements are thermally isolated from each other.

Figure 10:
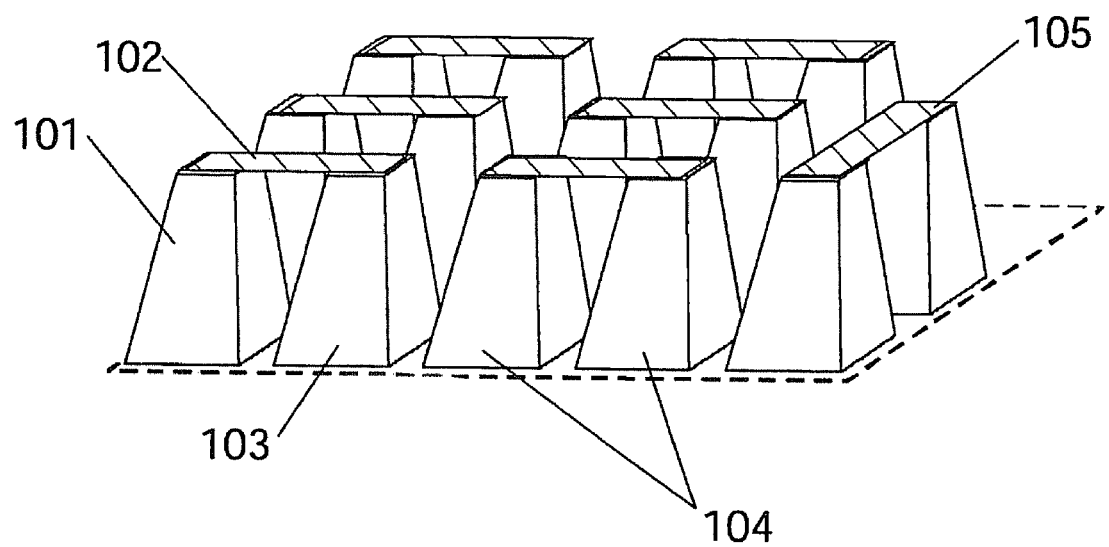
FIG. 10 illustrates electrical interconnections between various Peltier system elements of this nature.

An electronic circuit may be arranged in view of such configurations. FIG. 10 is drawn to illustrate the conductors which may be used to join individual Peltier elements as a single series electronic circuit. Current starting at Peltier element 101, may flow through conductor 102 and through Peltier element 103. A connector (not shown) in the hot plane joins the first Peltier couple to a second Peltier pair 104. Electrical current again traverses through a first Peltier element, across a conductor and down to the hot plane through another Peltier element. This process is repeated until all Peltier elements are appropriately joined together. Certain conductor elements 105 may need to be placed orthogonally with respect to the others, in order to join one first row of Peltier elements with a second adjacent row of Peltier elements.

Figure 11:
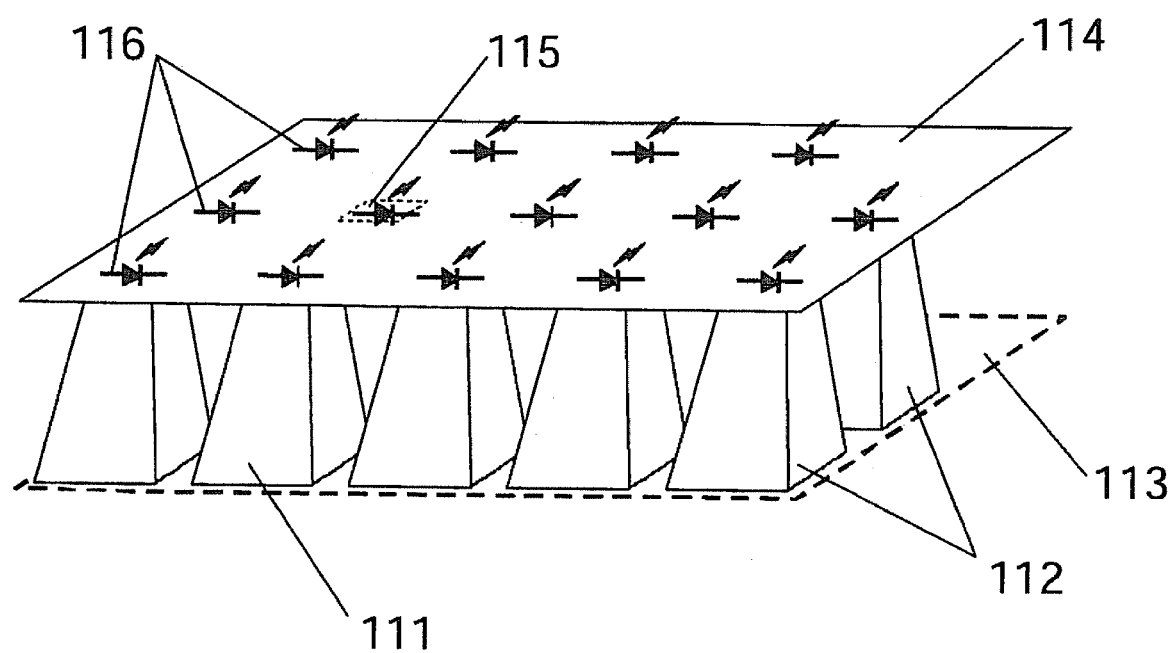
FIG. 11 illustrates an array of cooled electronic elements, in this case light emitting diodes, which may be used in conjunction with these spatial Peltier assemblies.

FIG. 11 shows a special arrangement of a plurality of high-performance light emitting diodes distributed about an array. Peltier elements 111, are arranged in pairs 112 between the hot plane 113 and a cold plane 114. It is important to note that the hot plane is nearly entirely covered by the large surface of the plurality of Peltier elements.

Conversely, the cold plane does not have this attribute. The cold plane is distinguished therefrom because it is comprised of a plurality of cold spots 115 of limited area. These cold spots are ideally suited to accommodate therein point-type heat producing sources. A plurality of heat producing sources 116, therefore, is ideally distributed about the top surface of the cold plane to produce an array type system. It is very important to note the desirability that the hot plane is comprised of a substrate having high thermal conductivity. For effective heat dissipation, it is preferred that heat spread quickly about the entire plane. The opposite is true of the cold plane. It is desirable that cold spots remain isolated with respect to the rest of the plane and further that heat is prevented from passing from any portion of the plane into a cold spot. Thus it is desirable that a cold plane be formed from a substrate having a low thermal conductivity.

Figure 12:
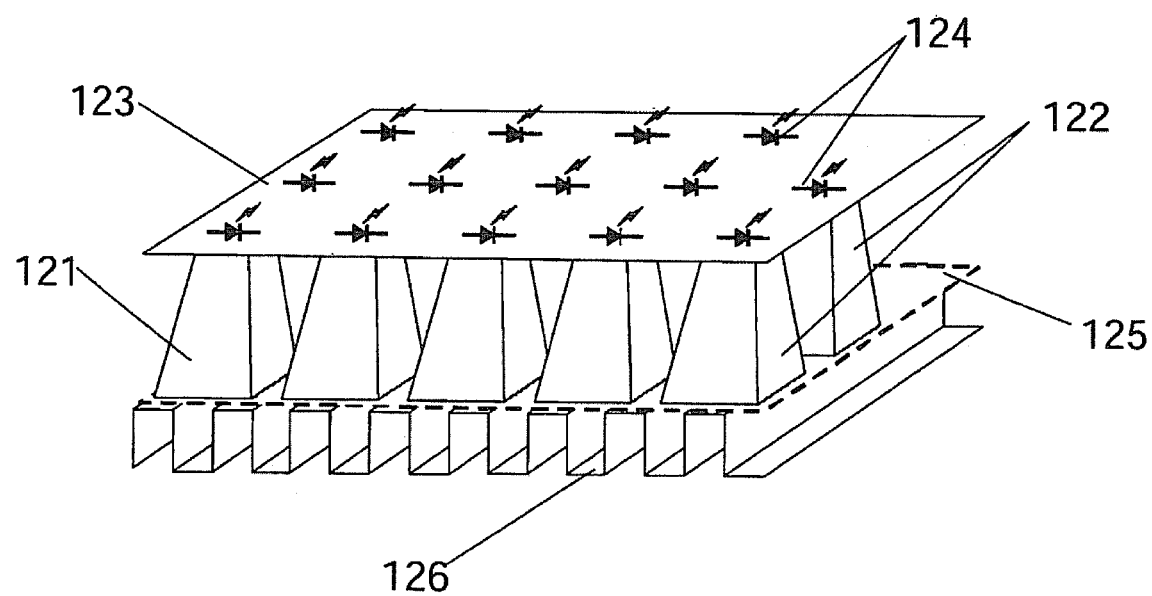
FIG. 12 further illustrates details relating to the 'hot side' of such assemblies which may include a heat sink element.

These systems are well suited to cooperate with, and may be joined by conventional heat dissipation means. For example, the hot plane of devices of these inventions can be thermally coupled to heat sinks having large surface area. FIG. 12 illustrates a Peltier element 121 and Peltier element pair 122 which separate cold plane 123 having thereon high-performance electronic elements 124. Hot plane 125, which is highly conductive with respect to heat, is coupled to heat sink 126. The heat sink is arranged whereby air may pass therethrough, for example, in a fan driven system and provides a system with excellent means for final heat dissipation into surrounding air. Thus, it is easy to see how systems of these inventions may be coupled to an interface with conventional devices such as high-performance light emitting diodes in common mechanical heat sinks.

One will now fully appreciate how Peltier semiconductor heat transfer systems may be arranged to focus or concentrate the cooling effect to a small area. Although the present invention have been described in considerable detail with clear and concise language and with reference to certain preferred versions thereof, including best modes anticipated by the inventors, other versions are possible. Therefore, the spirit and scope of the invention should not be limited by the description of the preferred versions contained therein, but rather by the claims hereto.

The invention claimed is:

1. Peltier effect semiconductor heat transfer system comprising:
   at least one semiconductor element pair arranged to yield Peltier effect heat transfer, said semiconductor element pair comprising one P-type doped semiconductor element and one N-type doped semiconductor element, each element having a cold end and a hot end, further said element pair being arranged to form a portion of a serial electronic circuit and a portion of a parallel thermal circuit;
   an active area thermally coupled to the cold ends of said at least one P-type doped semiconductor element and one N-type doped semiconductor element; and
   a hot area thermally coupled to the hot ends of said at least one P-type doped semiconductor element and one N-type doped semiconductor element, said hot ends being appreciably larger than said cold ends, wherein the thermal coupling of the cold end of each semiconductor element to the active area lies in a first plane, the thermal coupling of the hot end of each semiconductor element to the hot area lies in a second plane, and the first and second planes are disposed transverse to each other.

2. Peltier effect semiconductor heat transfer system of claim 1, said cold ends arranged to thermally couple with a single contiguous active area characterized as an annulus or circle, said hot ends arranged to thermally couple with a hot area characterized as a substantially cylindrical element.

3. Peltier effect semiconductor heat transfer system of claim 2, said hot area is fashioned as a heat sink having a high thermal conductivity suitable for transmission of heat from said hot ends to a heat dump.

4. Peltier effect semiconductor heat transfer system of claim 2, said hot area being substantially concentric with said active area.

5. Peltier effect semiconductor heat transfer system of claim 1, said active area is formed of a material having a high thermal conductivity.

6. Peltier effect semiconductor heat transfer system of claim 1, said active area is fashioned as a plurality of fields distributed about a planar region.

7. Peltier effect semiconductor heat transfer system of claim 6, said plurality of fields are rectangular areas distributed in an array arrangement.

8. Peltier effect semiconductor heat transfer system of claim 7, said plurality of fields comprise a total area which less than 50% of said hot area.

9. Peltier effect semiconductor heat transfer system of claim 6, said hot area is fashioned as a plurality of fields distributed about a hot plane planar region.

10. Peltier effect semiconductor heat transfer system of claim 9, said hot plane being fashioned of thermally conductive material whereby heat easily passes from hot ends into said hot plane.

11. Peltier effect semiconductor heat transfer system of claim 6, said cold plane is characterized as a substrate having low thermal conductivity.

12. Peltier effect semiconductor heat transfer system of claim 6, said hot plane is characterized as a substrate having high thermal conductivity.

13. Peltier effect semiconductor heat transfer system of claim 2, said cold ends are characterized as a substrate said active area has high thermal conductivity and low electrical conductivity.

* * * * *

UNITED STATES PATENT AND TRADEMARK OFFICE
CERTIFICATE OF CORRECTION

Page 1 of 1

PATENT NO.       : 7,823,393 B2
APPLICATION NO.  : 12/166889
DATED            : November 2, 2010
INVENTOR(S)      : Abramov et al.

It is certified that error appears in the above-identified patent and that said Letters Patent is hereby corrected as shown below:

Title Page;

<u>Face of the Patent</u>, See Item (57) ABSTRACT, line 6, "Peltier called side" should read
-- Peltier cold side --

<u>Face of the Patent</u>, See Item (57) ABSTRACT, line 11, "cooling fact" should read
-- cooling face --

<u>Face of the Patent</u>, See Item (57) ABSTRACT, lines 13-14, "laser are high-performance"
should read -- laser or high-performance --

<u>Column 12</u>, lines 59-60, "area which less than 50%" should read
-- area which is less than 50% --

Signed and Sealed this
Fifth Day of April, 2011

David J. Kappos
*Director of the United States Patent and Trademark Office*